US009562668B2

(12) United States Patent
Zhang et al.

(10) Patent No.: US 9,562,668 B2
(45) Date of Patent: Feb. 7, 2017

(54) LUMINOUS DEVICE COMPRISING A WAVELENGTH CONVERSION UNIT HAVING AN ARC-SHAPED JUNCTION PORTION AND LIQUID CRYSTAL DISPLAY DEVICE

(71) Applicants: SHENZHEN CHINA STAR OPTOELECTRONICS TECHNOLOGY CO., LTD., Guangdong (CN); WUHAN CHINA STAR OPTOELECTRONICS TECHNOLOGY CO., LTD., Wuhan, Hubei (CN)

(72) Inventors: Hanchi Zhang, Guangdong (CN); Gege Zhou, Guangdong (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 81 days.

(21) Appl. No.: 14/651,343

(22) PCT Filed: Apr. 7, 2015

(86) PCT No.: PCT/CN2015/075939
§ 371 (c)(1),
(2) Date: Jun. 11, 2015

(87) PCT Pub. No.: WO2016/155029
PCT Pub. Date: Oct. 6, 2016

(65) Prior Publication Data
US 2016/0290601 A1    Oct. 6, 2016

(30) Foreign Application Priority Data

Mar. 30, 2015    (CN) .......................... 2015 1 0144635

(51) Int. Cl.
*G02F 1/1335*    (2006.01)
*H01L 33/50*    (2010.01)
(Continued)

(52) U.S. Cl.
CPC ............... F21V 9/16 (2013.01); G02B 6/0066 (2013.01); G02F 1/1336 (2013.01); H01L 33/50 (2013.01); *G02F 2001/133614* (2013.01)

(58) Field of Classification Search
CPC ..................... F21V 9/16; G02B 6/0066; G02F 2001/133614; G02F 1/1336; H01L 33/50
See application file for complete search history.

(56) References Cited

U.S. PATENT DOCUMENTS

2008/0180948 A1*  7/2008  Yoon .................. C09K 11/0883
                                               362/230
2009/0261366 A1* 10/2009  Eisert ...................... H01L 33/46
                                                257/98
(Continued)

*Primary Examiner* — Paul Lee
(74) *Attorney, Agent, or Firm* — Ladas & Parry LLP

(57) ABSTRACT

A luminous device and a liquid crystal display device are provided. In the luminous device, a difference value between a first distance and a second distance is less than a preset value. The first distance is a distance between a first luminous side surface of a luminous element and a first wavelength conversion side surface of a wavelength conversion unit or a distance between a second luminous side surface and a second wavelength conversion side surface. The second distance is a distance between a luminous top surface of the luminous element and a wavelength conversion top surface of the wavelength conversion unit.

15 Claims, 2 Drawing Sheets

(51) Int. Cl.
*F21V 9/16* (2006.01)
*F21V 8/00* (2006.01)

(56) References Cited

U.S. PATENT DOCUMENTS

2012/0274878 A1* 11/2012 Kunz ................ H01L 33/50
  349/69
2013/0107573 A1* 5/2013 Kadomi ............ G02F 1/133617
  362/611

* cited by examiner

LUMINOUS DEVICE COMPRISING A WAVELENGTH CONVERSION UNIT HAVING AN ARC-SHAPED JUNCTION PORTION AND LIQUID CRYSTAL DISPLAY DEVICE

FIELD OF THE INVENTION

The present invention relates to a field of display devices, and more particularly, to a luminous device and a liquid crystal display device.

BACKGROUND OF THE INVENTION

Nowadays, a liquid crystal display device serves as a display unit of an electrical device, and has been widely used in various electronic products. A luminous device is an important part of the liquid crystal display device for providing back light to the liquid crystal display device.

In general, as shown on FIG. 1, the luminous device comprises a base 11, a luminous element 12 disposed on the base 11 for providing light, which comprises a body section 121, a anode section 122, and a cathode section 123, and a wavelength conversion unit 13 for converting a wavelength of the light emitting from the luminous element 12.

However, a body section serves as an important component part of the luminous device. Since distances between each surface of the body section and a corresponding surface of the wavelength conversion unit are different, for example a distance between a left side surface of the body section and a left side surface of the wavelength conversion unit is different from a distance between a top surface of the body section and a top surface of the wavelength conversion unit, a chromatic aberration phenomenon in the light emitting from the luminous device is produced.

Accordingly, it is necessary to provide a luminous device and a liquid crystal display device to solve the technical problem in the prior art.

SUMMARY OF THE INVENTION

An object of the present invention is to provide a luminous device and a liquid crystal display device to solve the technical problem of a chromatic aberration phenomenon in emitting light caused by distances between each surface of a body section and a corresponding surface of a wavelength conversion unit being different.

In order to solve the above-mentioned problems, the present invention provides a luminous device, comprising:

A base;

A luminous element is disposed on the base, where the luminous element is used for providing light. The luminous element comprises a body section, an anode section, and a cathode section. The luminous element comprises a first luminous side surface, a second luminous side surface, a luminous top surface, and a luminous bottom surface; and A wavelength conversion unit is disposed on the luminous element, where the wavelength conversion unit is used for converting a wavelength of the light emitting from the luminous element. The wavelength conversion unit comprises a first wavelength conversion side surface, a second wavelength conversion side surface, a wavelength conversion top surface, and a wavelength conversion bottom surface.

A difference value between a first distance and a second distance is less than a preset value, where the first distance is a distance between the first luminous side surface and the first wavelength conversion side surface or a distance between the second luminous side surface and the second wavelength conversion side surface, and the second distance is a distance between the luminous top surface and the wavelength conversion top surface. A distance between the first wavelength conversion side surface and the first luminous side surface is less than a distance between the second wavelength conversion side surface and the first luminous side surface.

A shape at a junction portion between the first wavelength conversion side surface and the wavelength conversion top surface is arc-shaped, and a shape at a junction portion between the second wavelength conversion side surface and the wavelength conversion top surface is arc-shaped.

A shape at a junction portion between the first luminous side surface and the luminous top surface is arc-shaped, and a shape at a junction portion between the second luminous side surface and the luminous top surface is arc-shaped.

In the luminous device of the present invention, the luminous device further comprises a reflection unit. The reflection unit is used for guiding the light emitting from the luminous element toward a light receiving section.

In the luminous device of the present invention, the reflection unit is located under the base and at two sides of the base.

In the luminous device of the present invention, the luminous device is further provided with a light guide plate on two sides thereof.

In order to solve the above-mentioned problems, the present invention provides a luminous device, comprising:

A base;

A luminous element is disposed on the base, where the luminous element is used for providing light. The luminous element comprises a body section, an anode section, and a cathode section. The luminous element comprises a first luminous side surface, a second luminous side surface, a luminous top surface, and a luminous bottom surface; and A wavelength conversion unit is disposed on the luminous element, where the wavelength conversion unit is used for converting a wavelength of the light emitting from the luminous element. The wavelength conversion unit comprises a first wavelength conversion side surface, a second wavelength conversion side surface, a wavelength conversion top surface, and a wavelength conversion bottom surface.

A difference value between a first distance and a second distance is less than a preset value, where the first distance is a distance between the first luminous side surface and the first wavelength conversion side surface or a distance between the second luminous side surface and the second wavelength conversion side surface, and the second distance is a distance between the luminous top surface and the wavelength conversion top surface. A distance between the first wavelength conversion side surface and the first luminous side surface is less than a distance between the second wavelength conversion side surface and the first luminous side surface.

In the luminous device of the present invention, a shape at a junction portion between the first wavelength conversion side surface and the wavelength conversion top surface is arc-shaped, and a shape at a junction portion between the second wavelength conversion side surface and the wavelength conversion top surface is arc-shaped.

In the luminous device of the present invention, a shape at a junction portion between the first luminous side surface and the luminous top surface is arc-shaped, and a shape at a junction portion between the second luminous side surface and the luminous top surface is arc-shaped.

In the luminous device of the present invention, the luminous device further comprises a reflection unit. The reflection unit is used for guiding the light emitting from the luminous element toward a light receiving section.

In the luminous device of the present invention, a reflection unit is located under the base and at two sides of the base.

In the luminous device of the present invention, the luminous device is further provided with a light guide plate on two sides thereof.

The present invention further provides a liquid crystal display device, comprising:

A liquid crystal display panel; and

A luminous device.

The luminous device comprises:

A base;

A luminous element is disposed on the base, where the luminous element is used for providing light, and the luminous element comprises a body section, an anode section, and a cathode section. The luminous element comprises a first luminous side surface, a second luminous side surface, a luminous top surface, and a luminous bottom surface.

A wavelength conversion unit is disposed on the luminous element, where the wavelength conversion unit is used for converting a wavelength of the light emitting from the luminous element. The wavelength conversion unit comprises a first wavelength conversion side surface, a second wavelength conversion side surface, a wavelength conversion top surface, and a wavelength conversion bottom surface.

A difference value between a first distance and a second distance is less than a preset value, where the first distance is a distance between the first luminous side surface and the first wavelength conversion side surface or a distance between the second luminous side surface and the second wavelength conversion side surface, and the second distance is a distance between the luminous top surface and the wavelength conversion top surface. A distance between the first wavelength conversion side surface and the first luminous side surface is less than a distance between the second wavelength conversion side surface and the first luminous side surface.

In the liquid crystal display device of the present invention, a shape at a junction portion between the first wavelength conversion side surface and the wavelength conversion top surface is arc-shaped, and a shape at a junction portion between the second wavelength conversion side surface and the wavelength conversion top surface is arc-shaped.

In the liquid crystal display device of the present invention, a shape at a junction portion between the first luminous side surface and the luminous top surface is arc-shaped, and a shape at a junction portion between the second luminous side surface and the luminous top surface is arc-shaped.

In the liquid crystal display device of the present invention, the luminous device further comprises a reflection unit. The reflection unit is used for guiding the light emitting from the luminous element toward a light receiving section.

In the liquid crystal display device of the present invention, a reflection unit is located under the base and at two sides of the base.

In the luminous device and the liquid crystal display device of the present invention, by making distances between each surface of the body section of the luminous device and a corresponding surface of the wavelength conversion unit unified, a chromatic aberration phenomenon in the light emitting from the luminous device is prevented, thereby improving a display effect.

In order to make the present invention more clear, preferred embodiments and the drawings thereof are described in detail below.

DETAILED DESCRIPTION OF THE INVENTION

Figure 1:
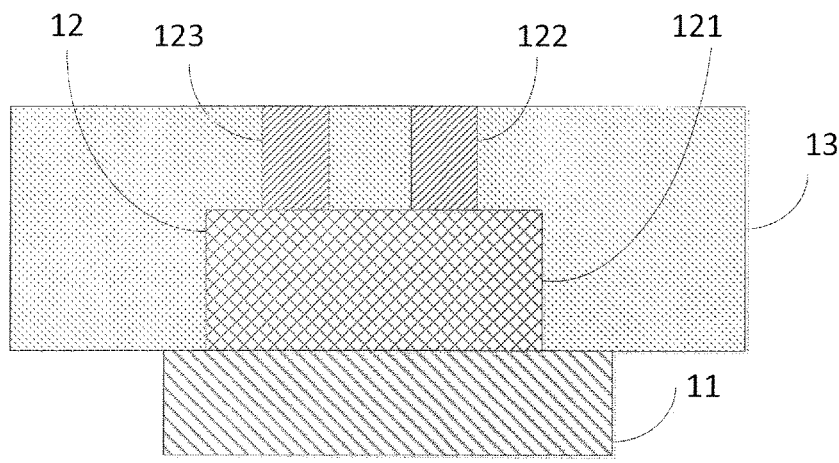
FIG. 1 is a structural schematic diagram of a conventional luminous device.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the drawings, the same reference symbol represents the same or a similar component.

Figure 2:
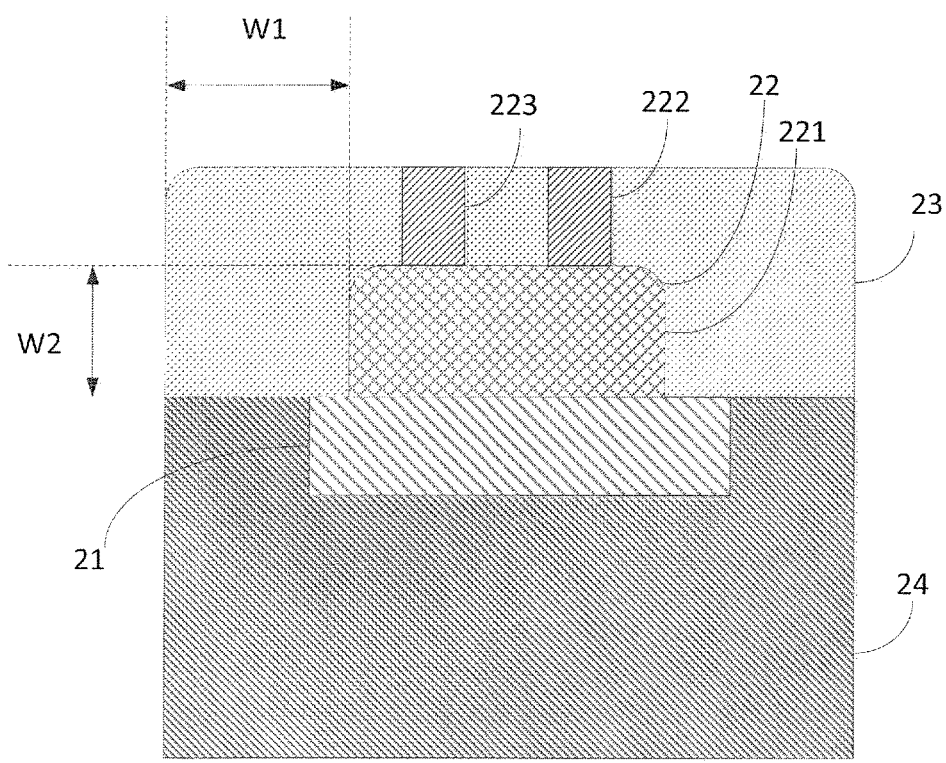
FIG. 2 is a structural schematic diagram of a luminous device of the present invention.

Please refer to FIG. 2, which shows a structural schematic diagram of a luminous device of the present invention.

As shown on FIG. 2, the luminous device of the present invention comprises a base 21, a luminous element 22, and a wavelength conversion unit 23. The luminous element 22 is disposed on the base 21 for providing light. The wavelength conversion unit 23 is disposed on the luminous element 22 for converting a wavelength of the light emitting from the luminous element 22. In general, the luminous element 22 emits a blue light which is then converted into a white light by the wavelength conversion unit 23.

Figure 3:
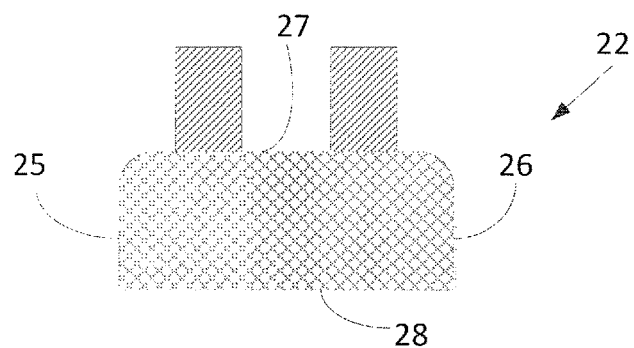
FIG. 3 is a structural schematic diagram of a luminous element of the present invention.

The luminous element 22 comprises a body section 221, an anode section 222, and a cathode section 223. A material of the body section 221 is a luminous material. Refer to FIG. 3, the luminous element 22 is a three-dimensional structure and has a first luminous side surface 25, a second luminous side surface 26, a luminous top surface 27, and a luminous bottom surface 28.

Figure 4:
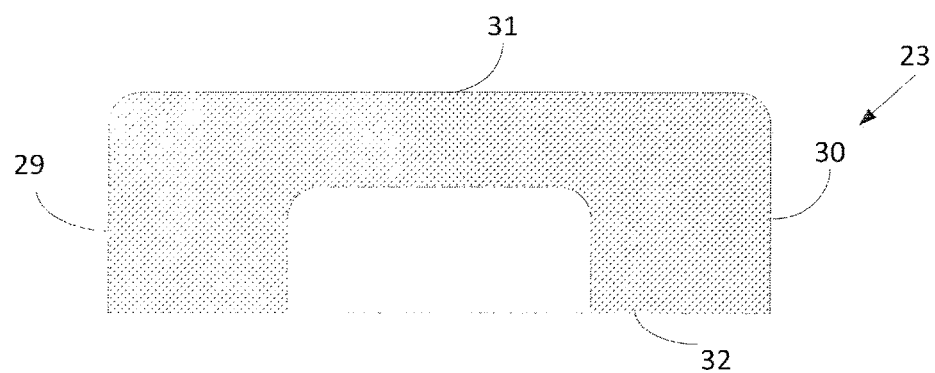
FIG. 4 is a structural schematic diagram of a wavelength conversion unit of the present invention.

Refer to FIG. 4, the wavelength conversion unit 23 comprises a first wavelength conversion side surface 29, a second wavelength conversion side surface 30, a wavelength conversion top surface 31, and a wavelength conversion bottom surface 32.

A distance between the first wavelength conversion side surface 29 and the first luminous side surface 25 is less than a distance between the second wavelength conversion side surface 30 and the first luminous side surface 25. That is, the first wavelength conversion side surface 29 and the first luminous side surface 25 are located on a same side of the luminous device, and the second wavelength conversion side surface 30 and the second luminous side surface 26 are located on another side of the luminous device.

The distance between the first luminous side surface 25 and the first wavelength conversion side surface 29 or the distance between the second luminous side surface 26 and the second wavelength conversion side surface 30 is defined as a first distance W1. The distance between the luminous top surface 27 and the wavelength conversion top surface 31 is defined as a second distance W2. A difference value between the first distance W1 and the second distance W2 is less than a preset value. The preset value is approximately zero, i.e. the first distance is approximately equal to the second distance. The difference value between the preset value and zero may be set according to a size of the liquid crystal display device.

Since the first distance is approximately equal to the second distance, path-lengths of light emitting from the luminous element along light directions are approximately equal. The path-lengths of light are approximately equal, so the energy dispersions of the light are equal. Since the color of light corresponds to the energy thereof, and the energy dispersions along emergent light directions of the luminous element are equal, the color of light will be uniform, and the chromatic aberration phenomenon will not appear, thereby improving a liquid crystal display effect.

Preferably, as shown on FIG. 4, a junction portion between the first wavelength conversion side surface 29 and the wavelength conversion top surface 31 is arc-shaped. A junction portion between the second wavelength conversion side surface 30 and the wavelength conversion top surface 31 is arc-shaped, too. Even though the chromatic aberration phenomenon is significantly decreased by the above-mentioned design, there is still a great distance between a top corner of the wavelength conversion unit 23 and a top corner of the luminous element 22. Thus, the top corner area is set as arc-shaped, and preferably circular, thereby decreasing the distance between the top corner area of the wavelength conversion unit and the top corner area of the luminous element, and further improving the chromatic aberration phenomenon.

Preferably, as shown in FIG. 3, a shape at a junction portion between the first luminous side surface 25 and the luminous top surface 27 is arc-shaped. A shape at a junction portion between the second luminous side surface 26 and the luminous top surface 27 is arc-shaped, too. Preferably, the arc-shaped at a top corner of the luminous element 22 matches the arc-shaped at a top corner of the wavelength conversion unit 23, thereby decreasing a distance difference between the top corner area of the wavelength conversion unit and the top corner area of the luminous element. By setting the top corner area of the luminous element to be arc-shaped, and preferably circular, the distance between the top corner area of the wavelength conversion unit and the top corner area of the luminous element is thereby decreased, ensuring that the paths of light at the top corner area and non-top corner area are equal, and further improving a display effect.

Preferably, referring to FIG. 2, the luminous device further comprises a reflection unit 24. The reflection unit 24 is used for guiding the light emitting from the luminous element 22 toward a light receiving section. The light receiving section is, for example, a light-entrance of the liquid crystal display panel. By providing the reflection unit, the waste of light can thus be prevented.

Preferably, the reflection unit 24 is located under the base 21 and at two sides of the base 21. Since the light receiving section is usually located above the luminous device, the light emitting from the luminous device facing a downward direction thereof cannot be inputted into the liquid crystal display panel. Thus, the light transmitting toward the downward direction is lead to the light-entrance of the liquid crystal display panel by providing the reflection unit, thereby reducing leakage of light.

Preferably, the luminous device is further provided with a light guide plate on two sides thereof. The light emitting from the luminous device to two sides thereof can be guided to the liquid crystal display panel by the light guide plate, thereby significantly reducing the leakage of light.

In the luminous device of the present invention, by making distances between each surface of the body section of the luminous device and a corresponding surface of the wavelength conversion unit equal, a chromatic aberration phenomenon in the light emitting from the luminous device is prevented, thereby improving a display effect.

The present invention further provides a liquid crystal display device, comprising a liquid crystal display panel and a luminous device. The liquid crystal display panel may comprise an array substrate, a color filter substrate, and a liquid crystal layer. The array substrate comprises data lines, scan lines, and a plurality of pixel units defined by the data lines and the scan lines. The color filter substrate is arranged corresponding to the array substrate. The color filter substrate may comprise a black matrix.

As shown on FIG. 2, the luminous device comprises a base 21, a luminous element 22, and a wavelength conversion unit 23. The luminous element 22 is disposed on the base 21 for providing light. The wavelength conversion unit 23 is disposed on the luminous element 22 for converting a wavelength of the light emitting from the luminous element 22. In general, the luminous element 22 emits a blue light which is then converted into a white light by the wavelength conversion unit 23.

The luminous element 22 comprises a body section 221, an anode section 222, and a cathode section 223. A material of the body section 221 is a luminous material. Refer to FIG. 3, the luminous element 22 is a three-dimensional structure and has a first luminous side surface 25, a second luminous side surface 26, a luminous top surface 27, and a luminous bottom surface 28.

Refer to FIG. 4, the wavelength conversion unit 23 comprises a first wavelength conversion side surface 29, a second wavelength conversion side surface 30, a wavelength conversion top surface 31, and a wavelength conversion bottom surface 32.

A distance between the first wavelength conversion side surface 29 and the first luminous side surface 25 is less than a distance between the second wavelength conversion side surface 30 and the first luminous side surface 25. That is, the first wavelength conversion side surface 29 and the first luminous side surface 25 are located on a same side of the luminous device, and the second wavelength conversion side surface 30 and the second luminous side surface 26 are located on another side of the luminous device.

The distance between the first luminous side surface 25 and the first wavelength conversion side surface 29 or the distance between the second luminous side surface 26 and the second wavelength conversion side surface 30 are defined a first distance W1. The distance between the luminous top surface 27 and the wavelength conversion top surface 31 is defined a second distance W2. A preset value is approximately zero, i.e. the first distance is approximately equal to the second distance. The difference value between the preset value and zero may be set according to a size of the liquid crystal display device.

Since the first distance is approximately equal to the second distance, path-lengths of light emitting from the luminous element along light directions are approximately equal. The path-lengths of light are approximately equal, so the energy dispersions of the light are equal. Since the color of light corresponds to the energy thereof, and the energy dispersions along emergent light directions of the luminous element are equal, the color of light will be uniform, and the chromatic aberration phenomenon will not appear, thereby improving a liquid crystal display effect.

Preferably, as shown on FIG. 4, a junction portion between the first wavelength conversion side surface 29 and the wavelength conversion top surface 31 is arc-shaped. A shape at a junction portion between the second wavelength conversion side surface 30 and the wavelength conversion top surface 31 is arc-shaped, too. Even though the chromatic aberration phenomenon is significantly decreased by the above-mentioned design, there is still a large distance between a top corner of the wavelength conversion unit 23 and a top corner of the luminous element 22. Thus, the top corner area is set as arc-shaped, and preferably circular, thereby decreasing the distance between the top corner area of the wavelength conversion unit and the top corner area of the luminous element, and further improving the chromatic aberration phenomenon.

Preferably, as shown on FIG. 3, a shape at a junction portion between the first luminous side surface 25 and the luminous top surface 27 is arc-shaped. A shape at a junction portion between the second luminous side surface 26 and the luminous top surface 27 is arc-shaped, too. Preferably, the arc-shaped at a top corner of the luminous element 22 is matched to the arc-shaped at a top corner of the wavelength conversion unit 23, thereby decreasing a distance difference between the top corner area of the wavelength conversion unit and the top corner area of the luminous element. By setting the top corner area of the luminous element to be arc-shaped, and preferably circular, the distance between the top corner area of the wavelength conversion unit and the top corner area of the luminous element is thereby decreased, ensuring that the paths of light at the top corner area and non-top corner area are equal, and further improving a display effect Preferably, referring to FIG. 2, the luminous device further comprises a reflection unit 24. The reflection unit 24 is used for guiding the light emitting from the luminous element 22 toward a light receiving section. The light receiving section is, for example, a light-entrance of the liquid crystal display panel. By providing the reflection unit, the leakage of light can thus be prevented.

Preferably, the reflection unit 24 is located under the base 21 and at two sides of the base 21. Since the light receiving section is usually located above the luminous device, the light emitting from the luminous device facing a downward direction thereof cannot be inputted into the liquid crystal display panel. Thus, the light transmitting toward the downward direction is lead to the light-entrance of the liquid crystal display panel by providing the reflection unit, thereby decreasing the leakage of light.

Preferably, the luminous device is further provided with a light guide plate on two sides thereof. The light emitting from the luminous device to two sides thereof can be guided to the liquid crystal display panel by the light guide plate, thereby preferably decreasing the waste of light.

The liquid crystal display device of the present invention can employ any kind of luminous devices, as described above. The luminous device has been described above, and the descriptions thereof are thus omitted here.

In the luminous device of the present invention, by making distances between each surface of the body section of the luminous device and a corresponding surface of the wavelength conversion unit equal, a chromatic aberration phenomenon in the light emitting from the luminous device is prevented, thereby improving a display effect.

The above descriptions are merely preferable embodiments of the present invention, but are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A luminous device, comprising:
   a base;
   a luminous element, disposed on the base, for providing light, and the luminous element comprising a body section, an anode section, a cathode section, a first luminous side surface, a second luminous side surface, a luminous top surface, and a luminous bottom surface; and
   a wavelength conversion unit, disposed on the luminous element, for converting a wavelength of the light emitting from the luminous element, the wavelength conversion unit comprising a first wavelength conversion side surface, a second wavelength conversion side surface, a wavelength conversion top surface, and a wavelength conversion bottom surface,
   wherein a difference value between a first distance and a second distance is less than a preset value, wherein the first distance is a distance between the first luminous side surface and the first wavelength conversion side surface or a distance between the second luminous side surface and the second wavelength conversion side surface, and the second distance is a distance between the luminous top surface and the wavelength conversion top surface; and a distance between the first wavelength conversion side surface and the first luminous side surface is less than a distance between the second wavelength conversion side surface and the first luminous side surface;
   a shape at a junction portion between the first wavelength conversion side surface and the wavelength conversion top surface is arc-shaped, and a shape at a junction portion between the second wavelength conversion side surface and the wavelength conversion top surface is arc-shaped; and
   a shape at a junction portion between the first luminous side surface and the luminous top surface is arc-shaped, and a shape at a junction portion between the second luminous side surface and the luminous top surface is arc-shaped.

2. The luminous device according to claim 1, wherein the luminous device further comprises a reflection unit, the reflection unit is used for guiding the light emitting from the luminous element toward a light receiving section.

3. The luminous device according to claim 1, wherein a reflection unit is located under the base and at two sides of the base.

4. The luminous device according to claim 1, wherein the luminous device is further provided with a light guide plate on two sides thereof.

5. A luminous device, comprising:
   a base;
   a luminous element disposed on the base, for providing light, and the luminous element comprising a body section, an anode section, and a cathode section, a first luminous side surface, a second luminous side surface, a luminous top surface, and a luminous bottom surface; and a wavelength conversion unit disposed on the luminous element, for converting a wavelength of the light emitting from the luminous element, the wavelength conversion unit comprising a first wavelength conversion side surface, a second wavelength conversion side surface, a wavelength conversion top surface, and a wavelength conversion bottom surface, wherein a difference value between a first distance and a second distance is less than a preset value, wherein the first distance is a distance between the first luminous side surface and the first wavelength conversion side surface or a distance between the second luminous side surface and the second wavelength conversion side surface, and the second distance is a distance between the luminous top surface and the wavelength conversion top surface; and a distance between the first wavelength conversion side surface and the first luminous side surface is less than a distance between the second wavelength conversion side surface and the first luminous side surface.

6. The luminous device according to claim 5, wherein a shape at a junction portion between the first wavelength conversion side surface and the wavelength conversion top surface is arc-shaped, and a shape at a junction portion between the second wavelength conversion side surface and the wavelength conversion top surface is arc-shaped.

7. The luminous device according to claim 5, wherein a shape at a junction portion between the first luminous side surface and the luminous top surface is arc-shaped, and a shape at a junction portion between the second luminous side surface and the luminous top surface is arc-shaped.

8. The luminous device according to claim 5, wherein the luminous device further comprises a reflection unit, the reflection unit is used for guiding the light emitting from the luminous element toward a light receiving section.

9. The luminous device according to claim 5, wherein a reflection unit is located under the base and at two sides of the base.

10. The luminous device according to claim 5, wherein the luminous device is further provided with a light guide plate on two sides thereof.

11. A liquid crystal display device, comprising:
a liquid crystal display panel; and
a luminous device, comprising:
a base;
a luminous element disposed on the base, for providing light, and the luminous element comprising a body section, an anode section, a cathode section, a first luminous side surface, a second luminous side surface, a luminous top surface, and a luminous bottom surface; and a wavelength conversion unit disposed on the luminous element, for converting a wavelength of the light emitting from the luminous element, the wavelength conversion unit comprising a first wavelength conversion side surface, a second wavelength conversion side surface, a wavelength conversion top surface, and a wavelength conversion bottom surface, wherein a difference value between a first distance and a second distance is less than a preset value, wherein the first distance is a distance between the first luminous side surface and the first wavelength conversion side surface or a distance between the second luminous side surface and the second wavelength conversion side surface, and the second distance is a distance between the luminous top surface and the wavelength conversion top surface; and a distance between the first wavelength conversion side surface and the first luminous side surface is less than a distance between the second wavelength conversion side surface and the first luminous side surface.

12. The liquid crystal display device according to claim 11, wherein a shape at a junction portion between the first wavelength conversion side surface and the wavelength conversion top surface is arc-shaped, and a shape at a junction portion between the second wavelength conversion side surface and the wavelength conversion top surface is arc-shaped.

13. The liquid crystal display device according to claim 11, wherein a shape at a junction portion between the first luminous side surface and the luminous top surface is arc-shaped, and a shape at a junction portion between the second luminous side surface and the luminous top surface is arc-shaped.

14. The liquid crystal display device according to claim 11, wherein the luminous device further comprises a reflection unit, the reflection unit is used for guiding the light emitting from the luminous element toward a light receiving section.

15. The liquid crystal display device according to claim 11, wherein a reflection unit is located under the base and at two sides of the base.

* * * * *